United States Patent
Sugiyama et al.

(10) Patent No.: US 10,742,855 B2
(45) Date of Patent: Aug. 11, 2020

(54) CIRCUIT BOARD AND CIRCUIT MODULE

(71) Applicant: TAIYO YUDEN CO., LTD., Tokyo (JP)

(72) Inventors: Yuichi Sugiyama, Tokyo (JP); Masashi Miyazaki, Tokyo (JP); Yutaka Hata, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/143,356

(22) Filed: Sep. 26, 2018

(65) Prior Publication Data
US 2019/0104237 A1   Apr. 4, 2019

(30) Foreign Application Priority Data
Sep. 29, 2017   (JP) .................................. 2017-190593

(51) Int. Cl.
| | |
|---|---|
| H05K 1/00 | (2006.01) |
| H04N 5/225 | (2006.01) |
| H05K 1/18 | (2006.01) |
| H05K 1/11 | (2006.01) |
| H05K 3/46 | (2006.01) |
| H05K 1/02 | (2006.01) |

(52) U.S. Cl.
CPC ......... *H04N 5/2253* (2013.01); *H05K 1/0298* (2013.01); *H05K 1/113* (2013.01); *H05K 1/181* (2013.01); *H05K 1/189* (2013.01); *H05K 3/4691* (2013.01); *H04N 5/2257* (2013.01); *H05K 2201/10121* (2013.01); *H05K 2201/10151* (2013.01)

(58) Field of Classification Search
CPC .. H04N 5/2253; H04N 5/2257; H05K 1/0298; H05K 1/113; H05K 1/181; H05K 1/189; H05K 2201/10121; H05K 2201/10151; H05K 3/4691
USPC .......................................................... 361/749
See application file for complete search history.

(56) References Cited

U.S. PATENT DOCUMENTS

| | | | |
|---|---|---|---|
| 2006/0048164 A1* | 3/2006 | Fry ........................... | G06F 3/14 719/328 |
| 2014/0055651 A1* | 2/2014 | Chen ...................... | H04N 5/335 348/294 |

(Continued)

FOREIGN PATENT DOCUMENTS

| | | | |
|---|---|---|---|
| JP | 2006222182 | * | 8/2006 |
| JP | 2011-108929 A | | 6/2011 |

(Continued)

OTHER PUBLICATIONS

Japanese Office Action dated Sep. 3, 2019, in a counterpart Japanese patent application No. 2017-190593. (A machine translation (not reviewed for accuracy) attached.).

*Primary Examiner* — Yuriy Semenenko
(74) *Attorney, Agent, or Firm* — Chen Yoshimura LLP (57) ABSTRACT

A circuit board includes a flexible wiring board having a first section in one end and a second section next to the first section in a plan view; a plate-shaped reinforcing member embedded in the flexible wiring board in the first section; and a first multilayer wiring layer on a top surface of the flexible wiring board in the first section, the first multilayer wiring layer having an opening that exposes a portion of a top surface of the reinforcing member for mounting a device thereon.

11 Claims, 8 Drawing Sheets

(56) References Cited

U.S. PATENT DOCUMENTS

| | | | | |
|---|---|---|---|---|
| 2015/0373854 A1* | 12/2015 | Ikemoto | ............... | H04N 5/2257 361/767 |
| 2016/0241763 A1* | 8/2016 | Jung | ................... | H04N 5/2257 |
| 2017/0064825 A1* | 3/2017 | Ishihara | ................. | H05K 1/113 |
| 2017/0310861 A1* | 10/2017 | Wang | ................... | H04N 5/2254 |
| 2019/0068846 A1* | 2/2019 | Jung | ................... | H04N 5/2253 |

FOREIGN PATENT DOCUMENTS

| JP | 2017-152692 A | 8/2017 |
|---|---|---|
| JP | 2017-169164 A | 9/2017 |

\* cited by examiner

CIRCUIT BOARD AND CIRCUIT MODULE

BACKGROUND OF THE INVENTION

Technical Field

The present invention relates to a circuit module and a circuit board having a flexible section and a rigid section.

Background Art

In order to realize thinning and multi-functionality of components, there is demand that module substrates in mobile devices that include a camera function and the like be made even thinner. More specifically, while a method of using a connector and a method of bonding a module substrate and a flexible substrate when using a flexible substrate or the like to connect a main board and a module are well-known, decreasing the mounting area and increases in the overall thickness of the module have become issues. Thus, the use of composite circuit boards (rigid-flexible substrates) that provide a rigid section in a flexible substrate has been moving forward.

For example, a circuit board has been disclosed that includes: a deformable flexible section; a rigid section that includes an insulating base member and an electric circuit formed on the insulating base member, and is connected to the flexible section; and a reinforcing member that is formed at the peripheral edge of the insulating base member, imparts internal stress on the insulating base member, and is formed of an insulating resin that is more rigid than the insulating base member (see Patent Document 1, for example).

RELATED ART DOCUMENT

Patent Document

Patent Document 1: Japanese Patent Application Laid-Open Publication No. 2011-108929

SUMMARY OF THE INVENTION

However, in a case in which a semiconductor element such as a solid state imaging element is mounted on a rigid section, when the flatness of the region on which the element is mounted is not satisfactory, optical adjustment of the solid state imaging element becomes difficult, and handling a circuit board that includes the solid state imaging element becomes complicated, for example. Accordingly, the present invention is directed to a scheme that substantially obviates one or more of the problems due to limitations and disadvantages of the related art.

In view of the above-mentioned issues, an aim of the present invention is to provide a circuit board and a circuit module that increase the flatness of a region on which an element is mounted.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a circuit board, including: a flexible wiring board having a first section in one end and a second section next to the first section in a plan view; a plate-shaped reinforcing member embedded in the flexible wiring board in the first section; and a first multilayer wiring layer on a top surface of the flexible wiring board in the first section, the first multilayer wiring layer having an opening that exposes a portion of a top surface of the reinforcing member for mounting a device thereon.

In such a circuit board, the plate-shaped reinforcing member is embedded in the first end of the flexible wiring board, and a reinforcing section is formed in the first end. The first multilayer wiring layer is provided on the first primary surface of the first end. The first multilayer wiring layer has a recess that exposes the reinforcing member and is able to house an element. The exposed reinforcing member serves as the base for the element; thus, the present invention has excellent flatness in the region where the element is mounted.

The circuit board may further include a second multilayer wiring layer on a bottom surface of the flexible wiring board in the first section.

In such a circuit board, since the second multilayer wiring layer is provided on the second primary surface of the first end, the strength of the reinforcing section further increases. In addition, the number of wiring lines increases.

In the above-mentioned circuit board, the first multilayer wiring layer may include a bonding pad disposed directly above a portion of the reinforcing member that is not exposed by the opening.

In such a circuit board, since the bonding pad is disposed directly above the reinforcing member, the rigidity of the base of the bonding pad increases. As a result, even if wire bonding is applied on the bonding pad, it is unlikely that the bonding pad will sink or shift.

In the above-mentioned circuit board, the portion of the top surface of the reinforcing member exposed in the opening for mounting the device may have a flat surface.

In such a circuit board, since the reinforcing member has a flat surface on which the element can be mounted, the circuit board has excellent flatness in the region where the element is mounted.

In the above-mentioned circuit board, the portion of the top surface of the reinforcing member exposed in the opening may be coated with a conductive layer.

In such a circuit board, since a conductive layer is formed on the surface of the reinforcing member, it is unlikely that the surface of reinforcing member will be oxidized even though the reinforcing member is exposed in the recess.

In the above-mentioned circuit board, the reinforcing member may include a core member and an insulating layer formed thereon so that the exposed portion of the top surface of the reinforcing member is an insulating surface.

In the above-mentioned circuit board, the first multilayer wiring layer on the flexible wiring board in the first section may have another opening that exposes another portion of the top surface of the reinforcing member for mounting another device thereon.

In order to achieve the above-mentioned aim, a circuit module, including: a flexible wiring board having a first section in one end and a second section next to the first section in a plan view; a plate-shaped reinforcing member embedded in the flexible wiring board in the first section; a first multilayer wiring layer on a top surface of the flexible wiring board in the first section, the first multilayer wiring layer having an opening that exposes a portion of a top surface of the reinforcing member in the first section; and a semiconductor device face-up mounted on the portion of the top surface of the reinforcement member exposed by the opening in the first multilayer wiring layer.

In such a circuit module, the plate-shaped reinforcing member is embedded in the first end of the flexible wiring board, and a reinforcing section is formed in the first end. The first multilayer wiring layer is provided on the first primary surface of the first end. The first multilayer wiring layer has the recess that exposes the reinforcing member and is able to house an element. The exposed reinforcing member serves as the base for the element; thus, the present invention has excellent flatness in the region where the element is mounted. As a result, the optical precision of the semiconductor element mounted on the reinforcing member becomes satisfactory.

In the above-mentioned circuit module, the semiconductor device may be mounted on the reinforcing member with a conductive joining member therebetween.

In such a circuit module, since the semiconductor device is mounted on the reinforcing member with a conductive joining member therebetween, the heat-dissipating properties of the semiconductor element increase.

In the above-mentioned circuit module, the semiconductor device may be a solid state imaging element.

In such a circuit module, since the semiconductor element is a solid state imaging element, the circuit module functions as an imaging module. In another aspect, the present disclosure provides a circuit board, including: a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view, a plate-shaped reinforcing member having a flat top surface, embedded in the cavity or cutout of the wiring board in the first section; a first multilayer wiring layer on a top surface of the wiring board in the first section, the first multilayer wiring layer having an opening that exposes a portion of the flat top surface of the reinforcing member for mounting a device thereon, the first multilayer wiring layer being absent on the wiring board in the second section; a second multilayer wiring layer on a bottom surface of the wiring board in the first section, the second multilayer wiring layer being absent on the wiring board in the second section. In another aspect, the present disclosure provides a circuit module, including: the circuit board as set forth in claim 11; and the device mounted on the exposed portion of the flat top surface of the reinforcing member, the device being electrically connected to a wiring in the first multilayer wiring layer in the first section.

As mentioned above, according to the present invention, a circuit board and a circuit module are provided which increase the flatness of a region where an element is mounted.

It is to be understood that both the foregoing general description and the following detailed description are exemplary and explanatory, and are intended to provide further explanation of the invention as claimed.

DETAILED DESCRIPTION OF EMBODIMENTS

Embodiments of the present invention will be described below with reference to the drawings. In the respective drawings, there are instances in which XYZ axis coordinates are introduced. In the respective figures, the X, Y, and Z axes represent three mutually orthogonal axial directions, and the Z axis direction corresponds to a thickness direction of the circuit board.

Embodiment 1

Figure 1:
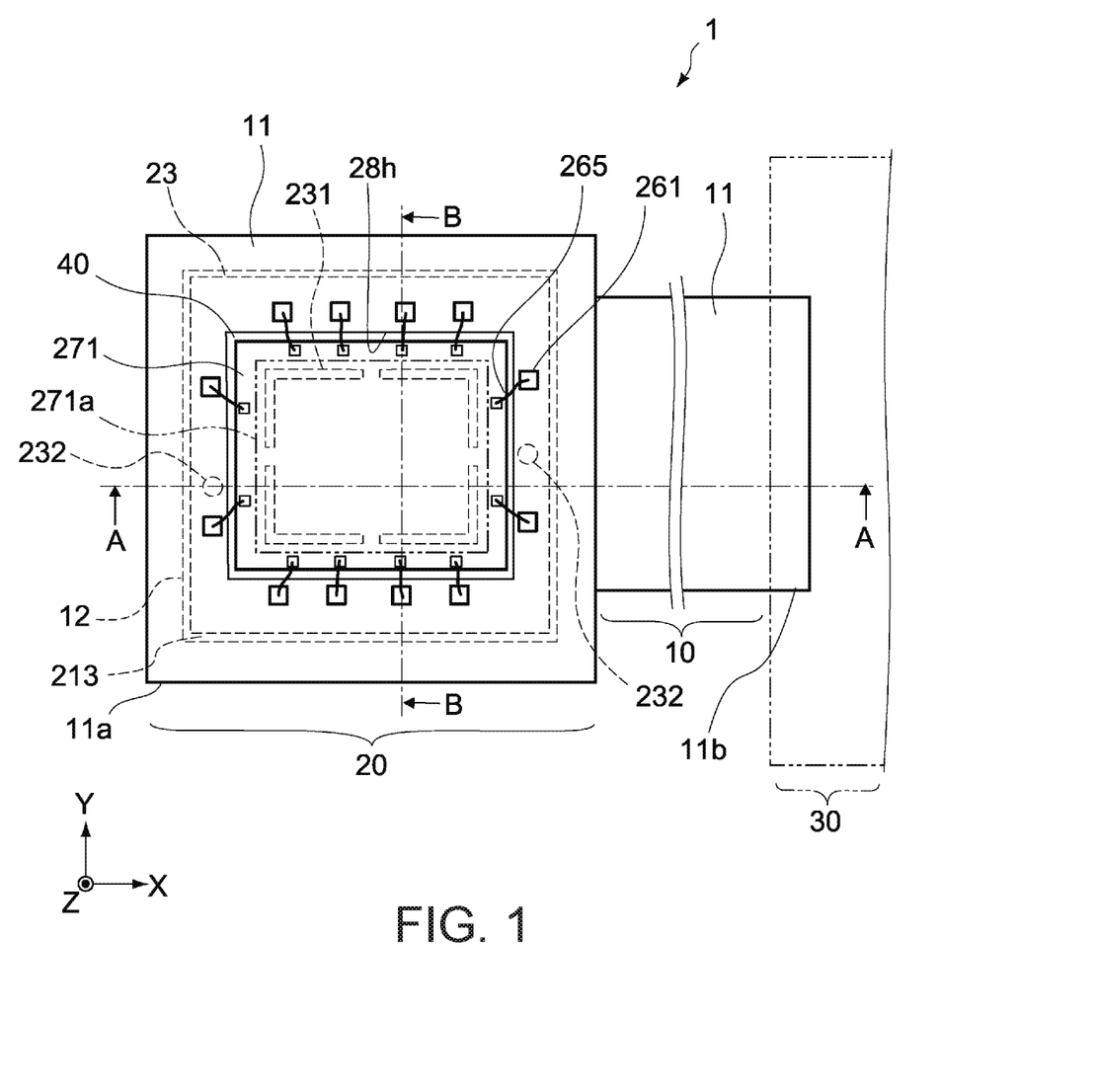
FIG. 1 is a schematic plan view that shows a configuration of a circuit board according to Embodiment 1 of the present invention.
Figure 2A:
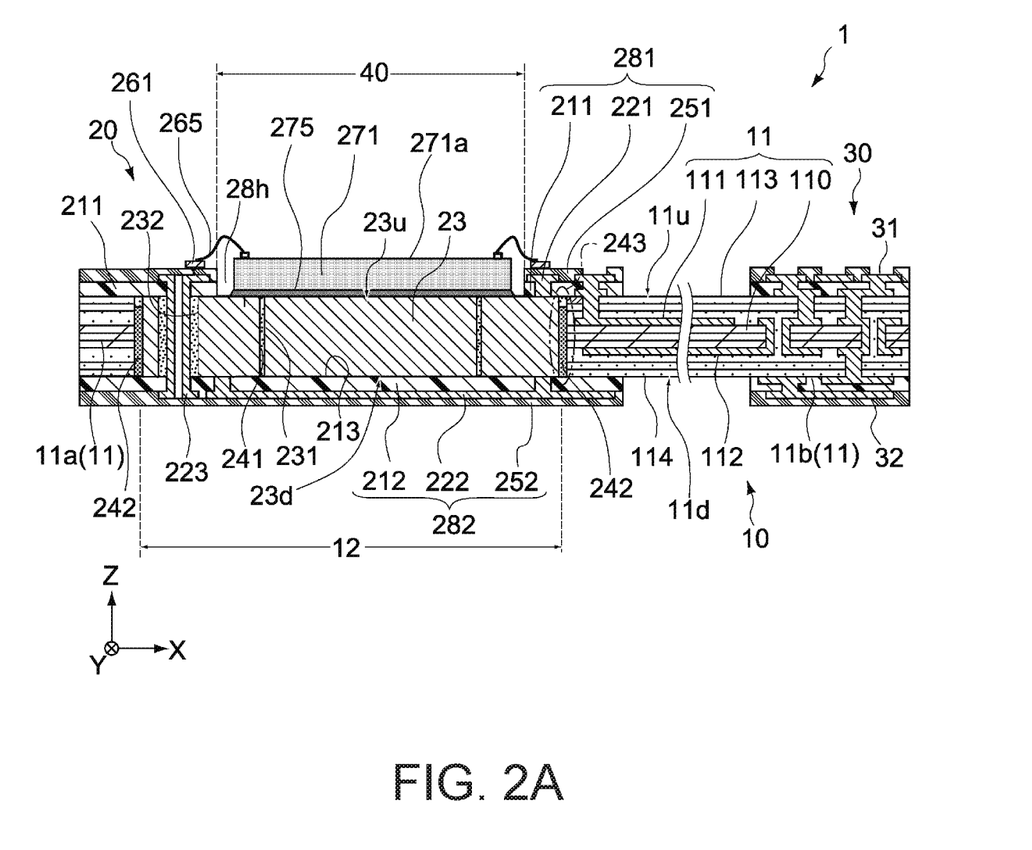
FIG. 2A is a cross-sectional view along a line A-A direction in FIG. 1.
Figure 2B:
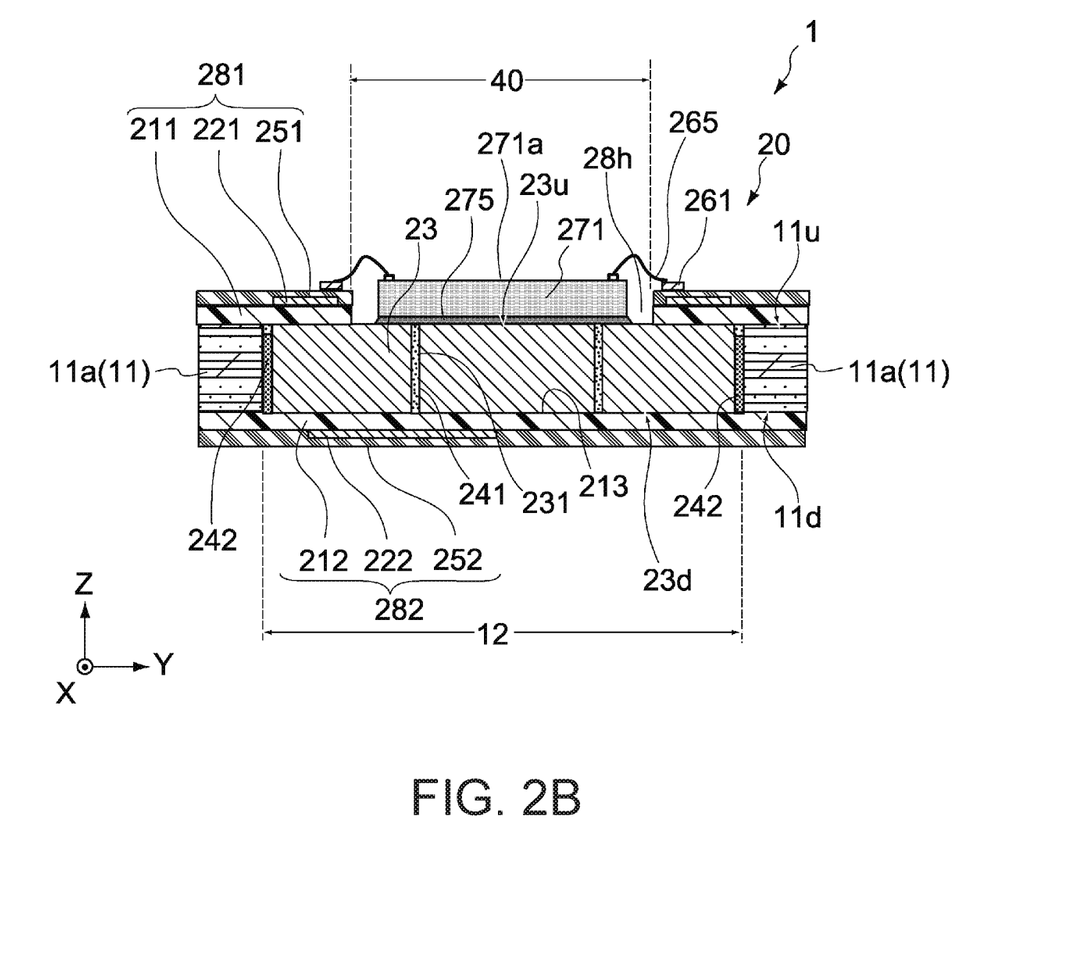
FIG. 2B is a cross-sectional view along a line B-B direction in FIG. 1.

FIG. 1 is a schematic plan view that shows a configuration of a circuit board according to Embodiment 1 of the present invention. FIG. 2A is a cross-sectional view along a line A-A direction in FIG. 1. FIG. 2B is a cross-sectional view along a line B-B direction in FIG. 1.

<Circuit Board>

As shown in FIG. 1, a circuit board 1 has a first substrate main body 10, and a second substrate main body 20. The second substrate main body 20 is connected to a control board 30 via the first substrate main body 10. In the circuit board 1 shown in FIG. 1, the first substrate main body 10, the second substrate main body 20, and the control board 30 are integrally configured; however, the control board 30 and the first substrate main body 10 and second substrate main body 20 may be configured as separate components.

(First Substrate Main Body)

The first substrate main body 10 includes a second end 11b of a flexible wiring board 11. Here, the configuration of the flexible wiring board 11, which not only forms the first substrate main body 10, but is also incorporated into the second substrate main body 20 and the control board 30, respectively, will be described.

For the flexible wiring board 11, the X axis direction is set as the lengthwise direction and the Y axis direction is set as the short direction (width direction), for example. The flexible wiring board 11 has a first end 11a and the second end 11b, which is connected to the first end 11a and is opposite of the first end 11a. The first end 11a has a primary surface 11u (first primary surface) and a primary surface 11d (second primary surface). At the first end 11a, the primary surface 11u is a top face of the flexible wiring board 11, and the primary surface 11d is a bottom face of the flexible wiring board 11. The primary surfaces 11u, 11d are respectively orthogonal to the thickness direction (Z axis direction).

The flexible wiring board 11 is a stacked body and includes: a resin core 110; wiring layers 111, 112 provided on both surfaces of the resin core 110; and insulating layers 113, 114 that cover the wiring layers 111, 112.

The resin core 110 is formed of a single-layer or multilayer flexible plastic film of a polyimide, polyethylene terephthalate, or the like, for example. The wiring layers 111, 112 are formed of a metal material such as copper or aluminum, for example. In addition, the insulating layers 113, 114 are formed of a flexible plastic film such as a polyimide that has an adhesive layer.

The wiring layer 111 is electrically connected to the wiring layer 112 by means of through-holes or via provided in appropriate locations of the resin core 110. The wiring layers of the flexible wiring board 11 are not limited to the two layers shown in the figures, and may be one layer or three or more layers.

The second end 11b of the flexible wiring board 11 forms a part of the first substrate main body 10, and is incorporated into the control board 30. The first end 11a of the flexible wiring board 11 is incorporated into the second substrate main body 20. The first substrate main body 10 forms a flexible section of the circuit board 1. In other words, as a result of the first substrate main body 10 being interposed between the second substrate main body 20 and the control board 30, it is possible to change the relative distance between the second substrate main body 20 and the control board 30, the angle of the second substrate main body 20 with respect to the control board 30, and the like, within a prescribed range.

(Second Substrate Main Body)

The second substrate main body 20 includes: the first end 11a of the flexible wiring board 11; a plate-shaped reinforcing member 23; a multilayer wiring layer 281 (first multilayer wiring layer); and a multilayer wiring layer 282 (second multilayer wiring layer). The first end 11a of the flexible wiring board 11, together with the reinforcing member 23, forms the core of the second substrate main body 20. In the circuit board 1, a reinforcing section 12 is formed of the multilayer wiring layers 281, 282 and the reinforcing member 23. The reinforcing section 12 is a rigid section of the circuit board 1. Since multilayer wiring layers are provided on both primary surfaces 11u, 11d of the first end 11a, a reinforcing section 12 having strong mechanical strength is formed. In addition, the number of wiring lines increases.

In the second substrate main body 20, a recess 28h is provided in the primary surface 11u of the first end 11a. A semiconductor element 271 is housed in the recess 28h. The semiconductor element 271 is electrically connected to a bonding pad 261 via bonding wires 265. The thickness of the semiconductor element 271 is not particularly limited, and may be set to 150 μm, for example.

The semiconductor element 271 is a solid state imaging element (optical sensor) such as a CCD (charge-coupled device) or CMOS (complementary MOS), for example. It is possible to form a circuit module by including the circuit board 1 and the semiconductor element 271. When the semiconductor element is a solid state imaging element, this circuit module functions as an imaging module. Note that a MEMS (microelectromechanical systems) sensor such as a pressure sensor or acceleration sensor, or the like, may be used as the semiconductor element 271.

The reinforcing member 23 is disposed below the semiconductor element 271. The semiconductor element 271 is mounted on the second substrate main body 20 such that an imaging surface 271a of the semiconductor element 271 and the primary surface 23u (or the primary surface 23d) of the reinforcing member 23 are parallel to each other. Here, the primary surface 23u is the top face of the reinforcing member 23, and the primary surface 23d is the bottom face of the reinforcing member 23.

The planar shape of the recess 28h is not particularly limited, and is set in accordance with the planar shape of the reinforcing member 23. For example, when the recess 28h and the reinforcing member 23 respectively project in the thickness direction (Z axis direction) of the reinforcing section 12, the recess 28h is included inside the reinforcing member 23 region. The planar shape of the recess 28h is formed in a rectangular shape that can be contained inside the reinforcing member 23, for example. The size of the planar shape of the recess 28h is not particularly limited, and the length of each side may be set to greater than or equal to 5 mm and less than or equal to 20 mm, for example. The depth of the recess 28h is not particularly limited, and may be set to greater than or equal to 130 μm and less than or equal to 150 μm, for example.

The multilayer wiring layer 281 includes: an insulating layer 211; wiring 221; an insulating layer 251; and the bonding pad 261. The multilayer wiring layer 282 includes: an insulating layer 212; wiring 222; and an insulating layer 252. The multilayer wiring layer 281 is provided on the primary surface 11u of the first end 11a and the primary surface 23u of the reinforcing member 23. The multilayer wiring layer 282 is provided on the primary surface 11d of the first end 11a and the primary surface 23d of the reinforcing member 23. The recess 28h which allows the reinforcing member 23 to expose and is able to house the semiconductor element 271 is provided in the multilayer wiring layer 281.

In the multilayer wiring layers 281, 282, the insulating layer 211 is disposed on the primary surface 23u of the reinforcing member 23 and the primary surface 11u of the first end 11a, and the insulating layer 212 is disposed on the primary surface 23d of the reinforcing member 23 and the primary surface 11d of the first end 11a.

The wiring 221 is provided on the surface of the insulating layer 211, and a portion of the wiring 221 is electrically connected to the reinforcing member 23 by means of via formed in appropriate locations of the insulating layer 211. The wiring 222 is provided on the surface of the insulating layer 212, and a portion of the wiring 222 is electrically connected to the reinforcing member 23 by means of via formed in appropriate locations of the insulating layer 212. The wiring 221, 222 is a so-called conductive pattern.

The wiring 221 and the wiring 222 are electrically connected by an interlayer connecting section 223. In addition, the wiring 221, 222 is electrically connected to the flexible wiring board 11 forming a part of the first substrate main body 10. Furthermore, the wiring 221, 222 is electrically connected to the bonding pad 261 disposed on the surface of the second substrate main body 20, and forms rewiring layers and the like that electrically connect the semiconductor element 271 to the flexible wiring board 11.

The wiring 221, 222 is not limited to a single-layer structure, and may have a multilayer structure. In addition, the present invention is not limited to a case in which both of the wiring 221, 222 are provided, and only one of the wiring 221, 222 may be provided.

An insulating layer 251 covers the insulating layer 211 and the wiring 221. An insulating layer 252 covers the insulating layer 212 and the wiring 222. The respective insulating layers 251, 252 may have openings (not shown) in appropriate locations where a portion of the surface of the wiring 221, 222 is exposed.

The bonding pad 261 is disposed on the multilayer wiring layer 281 on the primary surface 23u of the reinforcing member 23. The bonding pad 261 is disposed on the insulating layer 251, and is disposed directly above the reinforcing member 23, for example. The bonding pad 261 is a bonding pad for wire bonding, for example.

In the circuit board 1, the exterior shape of the second substrate main body 20 is formed by the multilayer wiring layers 281, 282. As shown in FIG. 1, the planar shape of the multilayer wiring layers 281, 282 is formed in long rectangular shape in the X axis direction, for example. The size of the planar shape of the multilayer wiring layers 281, 282 is not particularly limited. For example, for the planar shape of the multilayer wiring layers 281, 282, the long sides may be set to greater than or equal to 10 mm and less than or equal to 30 mm, the short sides may be set to greater than or equal to 10 mm and less than or equal to 20 mm, and the thickness may be set to greater than or equal to 0.2 mm and less than or equal to 0.5 mm. As shown in FIG. 1, the first end 11a is formed in a shape and size identical to the second substrate main body 20; the present invention is not limited to this, however, and the first end 11a may be configured larger or smaller than the second substrate main body 20.

The insulating layers 211, 212, 251, 252 are made of a synthetic resin material. A general purpose thermosetting resin material such as an epoxy resin, a phenol resin, or a BT resin is used as the synthetic resin material, for example. In order to impart a desired mechanical strength, these synthetic resin materials may contain a filler (a filling material) such as glass fibers, glass cloth, or oxidized particles, for example. The insulating layers 211, 212, 251, 252 may be respectively formed using the same resin material, or may be formed using mutually different resin materials.

The wiring 221, 222 is formed of a cured material of a metal paste or a metal material such as copper or aluminum, for example.

The reinforcing member 23 is embedded in the first end 11a. The reinforcing member 23 has the primary surface 23u, and the primary surface 23d opposite of the primary surface 23u. The reinforcing member 23 imparts a desired strength to the second substrate main body 20. The primary surface 23u of the reinforcing member 23 is a flat surface on which the semiconductor element 271 can be mounted. The semiconductor element 271 is mounted using a face-up method on the primary surface 23u of the reinforcing member 23 with a joining member 275 therebetween, for example.

The reinforcing member 23 may form a portion of either of the wiring 221, 222, and may be used as a portion of ground wiring, for example. Specifically, when the reinforcing member 23 is at the ground potential, there is no need of the time and effort for leading out ground wiring in the circuit board 1 while staying away from the reinforcing member 23. Furthermore, electromagnetic waves from outside the circuit board 1 or from the semiconductor element 271 are blocked by the reinforcing member 23. In addition, the reinforcing member 23 is a heat-dissipating component for the semiconductor element 271 mounted on the second substrate main body 20. The distance in the Z axis direction between the reinforcing member 23 and the semiconductor element 271 may be greater than or equal to 15 µm and less than or equal to 100 µm, for example, but is not limited to these numerical values.

The planar shape of the reinforcing member 23 is not particularly limited, and the reinforcing member 23 may be formed in a rectangular shape that can be housed inside the first end 11a of the flexible wiring board 11, for example. The size of the planar shape of the reinforcing member 23 is not particularly limited, with the length of each side being set to greater than or equal to 5 mm and less than or equal to 20 mm, and the thickness being set to greater than or equal to 0.1 mm and less than or equal to 0.4 mm, for example. The thickness of the reinforcing member 23 is not particularly limited, and, in the present embodiment, is set to a thickness substantially equal to that of the flexible wiring board 11.

By forming the reinforcing member 23 at a size that is able to substantially correspond to the entire first end 11a region of the flexible wiring board 11, the reinforcing member 23 is able to effectively carry out functioning as the core of the second substrate main body 20. In addition, by housing the entire reinforcing member 23 within the first end 11a, it is possible to ensure the insulating properties from the peripheral edges of the second substrate main body 20 without the reinforcing member 23 being exposed from the peripheral edges of the first end 11a. In particular, since both surfaces of the reinforcing member 23 are covered by the insulating layers 211, 212, the reinforcing member 23 is prevented from being exposed from both surfaces of the second substrate main body 20.

The reinforcing member 23 is built into a housing section 213 formed in the plane of the first end 11a of the flexible wiring board 11. The housing section 213 is constituted of a recess that does or does not have a bottom and is of a size that is able to house the reinforcing member 23. In the present embodiment, the housing section 213 is constituted of a rectangular recess (bottomless recess) that penetrates the first end 11a.

The reinforcing member 23 is made of a metal, a ceramic, or the like, for example. However, from the standpoint of the electrical characteristics and heat-dissipating properties of the circuit board 1, it is preferable that the reinforcing member 23 be made of metal. The reinforcing member 23 is formed of a body that conducts electricity and heat well, and is formed of a metal material such as copper (Cu), a copper alloy, aluminum, an aluminum alloy, or the like, for example.

In addition, the primary surface 23u of the reinforcing member 23 that is exposed by the recess 28h may be covered by a conductive layer. This conductive layer may be formed of a stacked body in which the outermost surface is an Au film, for example. For example, the conductive layer may be formed of a stacked body made of, starting from the bottom layer: a Cu film/an Ni film/an Au film, or an Ag film/a Pd film/an Au film. In such a configuration, even if the primary surface 23u of the reinforcing member 23 is exposed by the recess 28h, the surface of the reinforcing member 23 becomes less likely to be oxidized.

The joining member 275 is formed of soldering material, metal paste, a resin adhesive, double-sided tape, or the like, for example. Specifically, when semiconductor material is exposed from the bottom face of a semiconductor substrate of the semiconductor element 271, and when this semiconductor substrate and the reinforcing member 23 are being directly and electrically connected and/or the heat-dissipating properties of the semiconductor element 271 are being increased, it is preferable to use a conductive joining member such as a soldering material or conductive paste as the joining member 275.

A groove 231 that penetrates the plane of the reinforcing member 23 may be provided in the reinforcing member 23. The reinforcing member 23 is fixed inside the first end 11a by means of: a first insulating material 241 that fills the inside of the groove 231; and a second insulating material 242 that fills the space between the outer peripheral surfaces of the reinforcing member 23 and the inner peripheral surfaces of the housing section 213, for example.

In addition, a single or a plurality of penetrating holes 232 that penetrate the plane of the reinforcing member 23 may be provided in the reinforcing member 23. The penetrating holes 232 are formed at appropriate locations within the plane of the reinforcing member 23, and are provided between the peripheral edges of the reinforcing member 23 and the formation region of the groove 231, for example. The penetrating holes 232 are formed in circular holes of a size that can house the interlayer connecting sections 223. The interlayer connecting sections 223 are formed of copper plating formed so as to sandwich an insulating layer on the inner peripheral surface of the penetrating holes 232, for example. The above-mentioned insulating layer is made of the first insulating material 241, for example.

The first insulating material 241 is formed of a resin material in which the coefficient of thermal expansion is smaller and the modulus of elasticity is higher than those of the resin material forming the insulating layers 211, 212, for example. As a result of the first insulating material 241 being formed of a resin material in which the coefficient of thermal expansion is smaller than that of the insulating layers 211, 212, it is possible to ensure adhesion between the housing section 213 and the reinforcing member 23, and it is possible to prevent warping of the second substrate main body 20. In addition, as a result of the first insulating material 241 being formed of a resin material with a higher modulus of elasticity than the insulating layers 211, 212, the rigidity of the first insulating material 241 increases, and it is possible to improve the strength of the second substrate main body 20.

The material forming the first insulating material 241 is not particularly limited, and may be the same type of material as the resin material forming the insulating layers 211, 212, for example. In such a case, by increasing the filler content of the first insulating material 241 to higher than that of the insulating layers 211, 212, it is possible to form the first insulating material 241 in which the coefficient of thermal expansion is smaller and the modulus of elasticity is higher than those of the insulating layers 211, 212.

Meanwhile, the second insulating material 242 is formed of a material in which the modulus of elasticity is lower than that of the resin material forming the insulating layers 211, 212. As a result, bending stress applied to the peripheral edges of the second substrate main body 20 is alleviated via the second insulating material 242; thus, it is possible to prevent the reinforcing member 23 from detaching from the housing section 213. In addition, the second insulating material 242 may be formed of a material in which the water absorption rate is lower than that of the insulating layers 211, 212. As a result, volume expansion or swelling due to the absorption of water by the second insulating material 242 is suppressed.

The material forming the second insulating material 242 is not particularly limited; however, a material that has a strong affinity toward the flexible wiring board 11 is preferred, such as an epoxy, a polyimide, a liquid crystal polymer, a BT resin, PPS, and the like.

The second insulating material 242 fills the space between the outer peripheral surface of the reinforcing member 23 and the inner peripheral surface of the housing section 213. It is not necessary for the second insulating material 242 to be provided along the entire outer peripheral surface of the reinforcing member 23, and the second insulating material 242 may be provided on at least the second end 11b side of the flexible wiring board 11. As a result, it is possible to absorb or alleviate tensile stress or the like from the first substrate main body 10 by the second insulating material 242, and it is possible to suppress damage to the second substrate main body 20 and separation of the reinforcing section 12 from the first end 11a, for example.

In addition, the present invention is not limited to a case in which the entire region of the first end between the reinforcing member 23 and the housing section 213 is filled using the second insulating material 242, and as shown in FIGS. 2A and 2B, a stacked section 243 of the first insulating material 241 and the second insulating material 242 may be provided. In such a case, since this region has both appropriate rigidity and appropriate elasticity, it is possible to increase the connection reliability between the flexible wiring board 11 and the reinforcing section 12.

Note that, in accordance with the required characteristics, specifications, and the like, the second insulating material 242 may be omitted, and the first insulating material 241 may fill the space between the reinforcing member 23 and the housing section 213 in place of the second insulating material 242. In addition, as necessary, the stacked section 243 may be omitted, and the entire first end region may be filled using the first insulating material 241 or the second insulating material 242.

(Control Board)

The control board 30 corresponds to a main board on which an integrated circuit such as an IC, peripheral components of the integrated circuit, and the like are mounted, and the control board 30 is electrically connected to the second substrate main body 20 via the first substrate main body 10. The control board 30 is constituted of a double-sided substrate that has a larger area than the second substrate main body 20, for example.

The control board 30 is formed of a stacked body constituted of the second end 11b of the flexible wiring board 11, and multilayer wiring sections 31, 32 respectively provided on both surfaces of the second end 11b. The multilayer wiring sections 31, 32 are manufactured using the build-up method, for example. Interlayer insulating films forming the multilayer wiring sections 31, 32 may be formed of a material having the rigidity of a glass epoxy, and in such a case, the control board 30 is formed as a rigid substrate.

<Manufacturing Method of the Circuit Board>

A manufacturing method of the circuit board 1 will be described.

FIGS. 3A to 5D are schematic cross-sectional views for describing the manufacturing method of the circuit board.

Figure 3A:
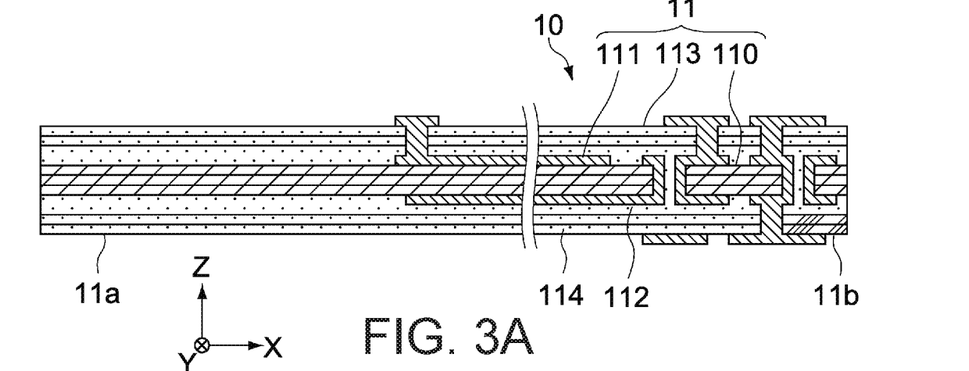
FIGS. 3A to 3D are schematic cross-sectional views for describing a manufacturing method of the circuit board.

First, as shown in FIG. 3A, the flexible wiring board 11 that forms the first substrate main body 10 and the second substrate main body 20 is prepared.

Figure 3B:
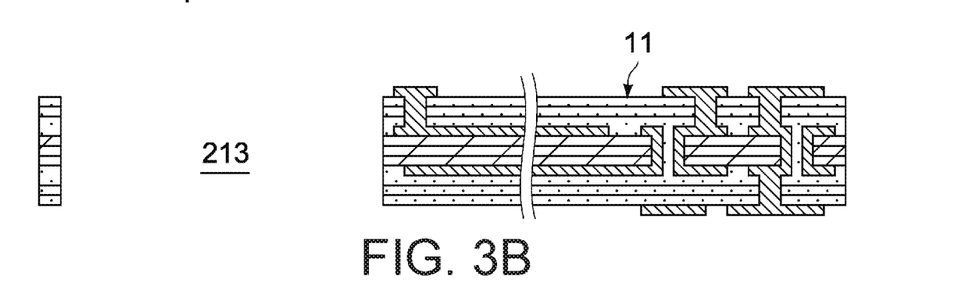

Next, as shown in FIG. 3B, the housing section 213 (recess) for housing the reinforcing member 23 is formed in a prescribed region of the first end 11a. The formation method of the housing section 213 is not particularly limited, and it is possible to use an appropriate method such as mechanical processing such as punching and grinding, or laser processing.

Figure 3C:
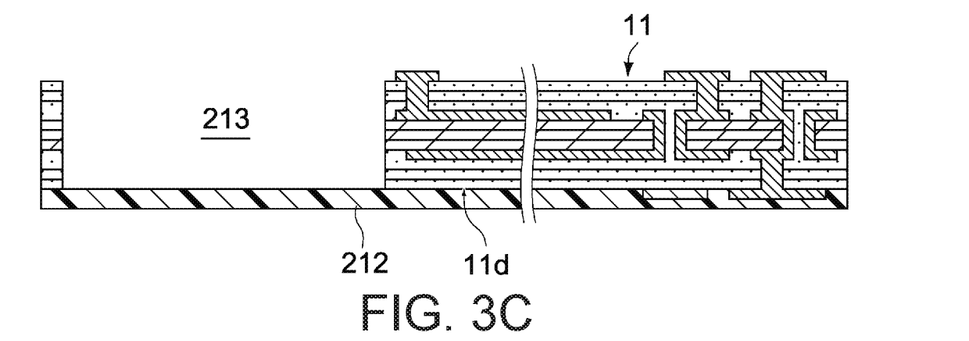

Next, as shown in FIG. 3C, the insulating layer 212 that covers the housing section 213 is formed on the primary surface 11d of the flexible wiring board 11. The formation method of the insulating layer 212 is not particularly limited, and it is possible to use an appropriate method such as coating, transcription, or lamination.

Figure 3D:
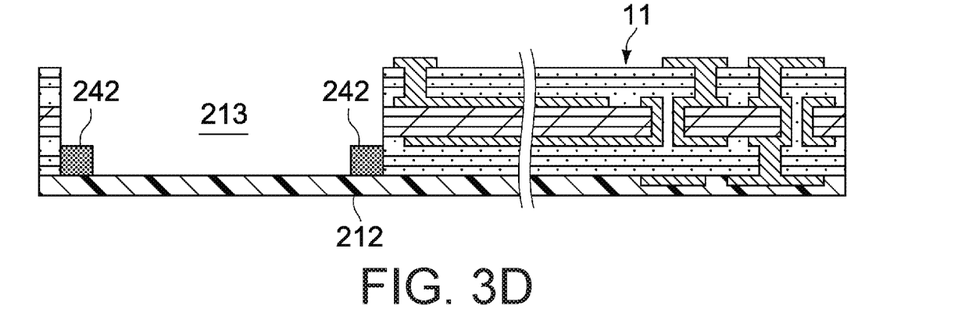

Next, as shown in FIG. 3D, a material that forms the second insulating material 242 is applied to the inner peripheral surfaces of the housing section 213 that are the boundary with the insulating layer 212.

Figure 4A:
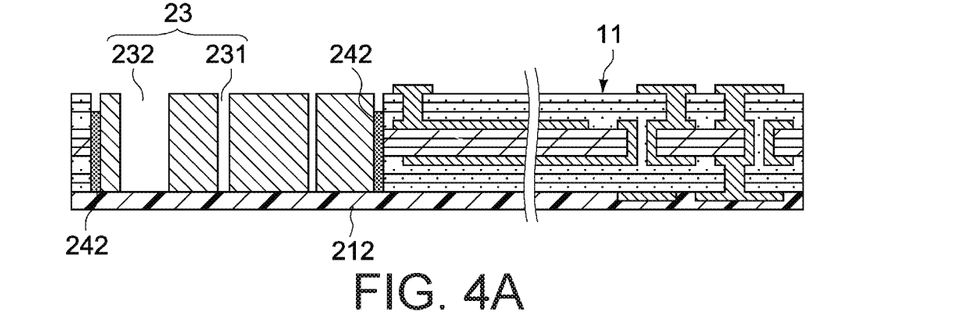
FIGS. 4A to 4D are schematic cross-sectional views for describing the manufacturing method of the circuit board.

Next, as shown in FIG. 4A, the reinforcing member 23 is disposed on the insulating layer 212 inside the housing section 213, and the second insulating material 242 fills between the outer peripheral surface of the reinforcing member 23 and the inner peripheral surface of the housing section 213 to a prescribed height. Note that, in such a case, a portion of the second insulating material 242 may be interposed between the reinforcing member 23 and insulating layer 212.

Figure 4B:
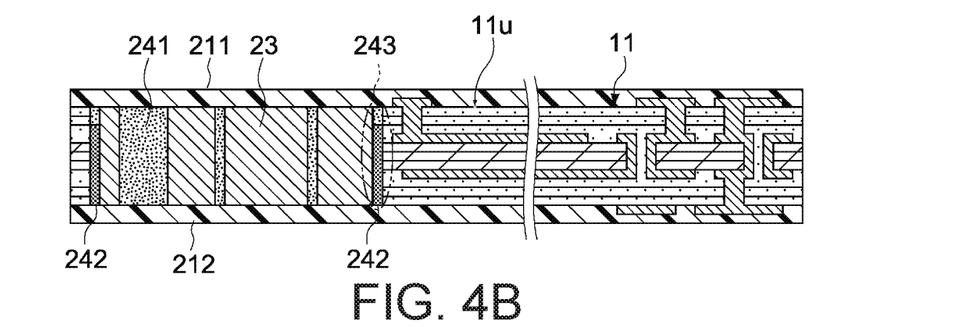

Next, as shown in FIG. 4B, a material that forms the first insulating material 241 fills the groove 231 and penetrating hole 232 of the reinforcing member 23. At such time, by providing the first insulating material 241 in the gap between the outer peripheral surface of the reinforcing member 23, the inner peripheral surface of the housing section 213, and the second insulating material 242, the stacked section 243 constituted of a stacked structure of the first and second insulating materials 241, 242 is formed.

Thereafter, the insulating layer 211 that covers the reinforcing member 23 is formed on the primary surface 11u of the flexible wiring board 11. The formation method of the insulating layer 211 is not particularly limited, and it is possible to use a method similar to the formation method of the insulating layer 212.

Figure 4C:
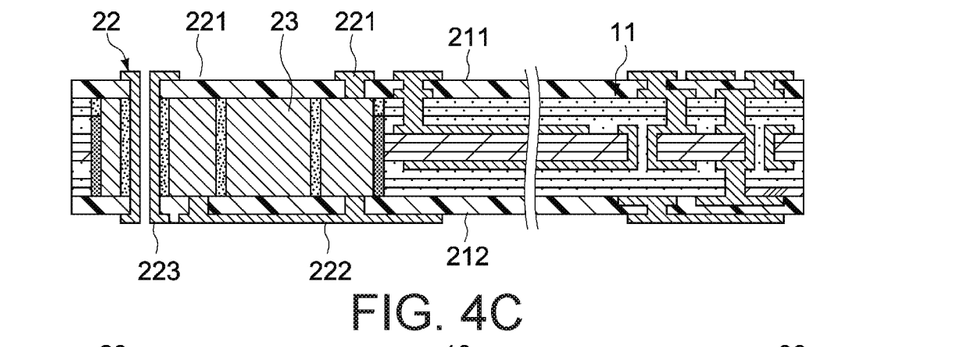

Next, as shown in FIG. 4C, the wiring 221 is formed on the surface of the insulating layer 211, and the wiring 222 is formed on the surface of the insulating layer 212. Furthermore, the interlayer connection section 223 that penetrates the reinforcing member 23 is formed. For the wiring 221, 222, an appropriate pattern formation method such as plating or etching can be used, and a portion of the wiring 221, 222 is connected to the reinforcing member 23 through via formed in the insulating layers 211, 212. The interlayer connecting section 223 is formed by forming a penetrating hole in the first insulating material 241 that has filled the penetrating hole 232 of the reinforcing member 23, growing a conductive layer via plating on the inner walls of the penetrating hole, and filling the penetrating hole with a conductive paste.

Figure 4D:
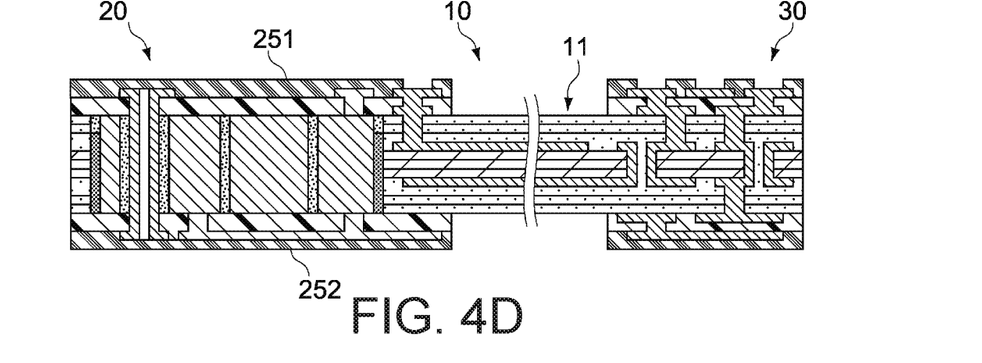

Next, as shown in FIG. 4D, the insulating layers 251, 252 that partially cover the insulating layers 211, 212 are respectively formed, and the insulating layers 211, 212 that are inside the formation region of the first substrate main body 10 are partially removed.

Figure 5A:
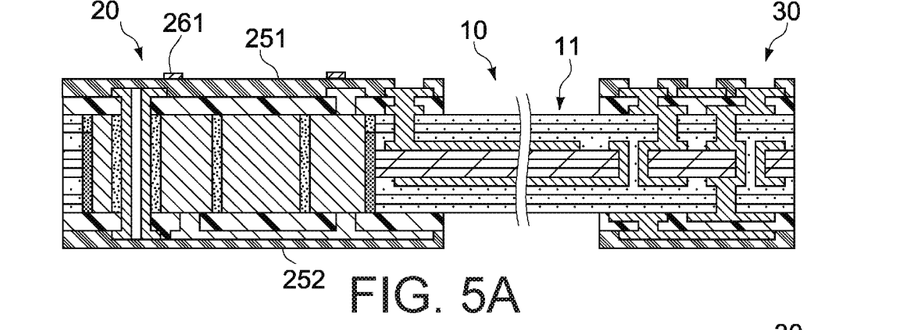
FIGS. 5A to 5D are schematic cross-sectional view for describing the manufacturing method of the circuit board.

Next, as shown in FIG. 5A, the bonding pad 261 is patterned on the insulating layer 251 directly above the reinforcing member 23. The bonding pad 261 is electrically connected to the wiring 221, for example. The bonding pad 261 may be electrically connected to the wiring 222.

Figure 5B:
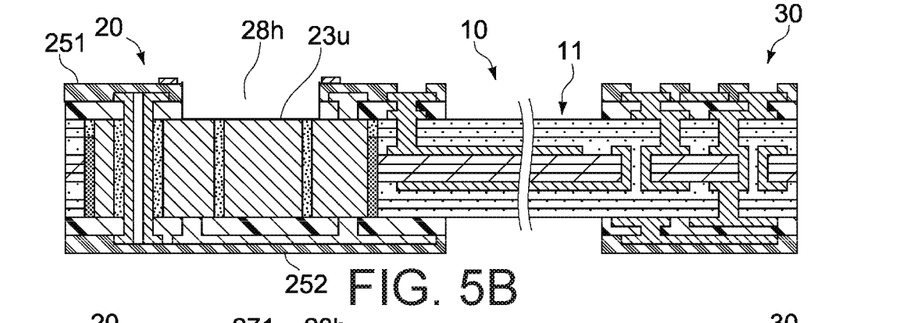

Next, as shown in FIG. 5B, the recess 28h for housing the semiconductor element 271 is formed in a prescribed region 40 (see, also, FIGS. 1 and 2A-2B) of the first end 11a. The formation method of the recess 28h is not particularly limited, and it is possible to use an appropriate method such as mechanical processing such as punching and grinding, or laser processing. The primary surface 23u of the reinforcing member 23 is exposed at the bottom of the recess 28h. In this manner, the circuit board 1 that includes the first substrate main body 10, the second substrate main body 20, and the control board 30 is manufactured.

Figure 5C:
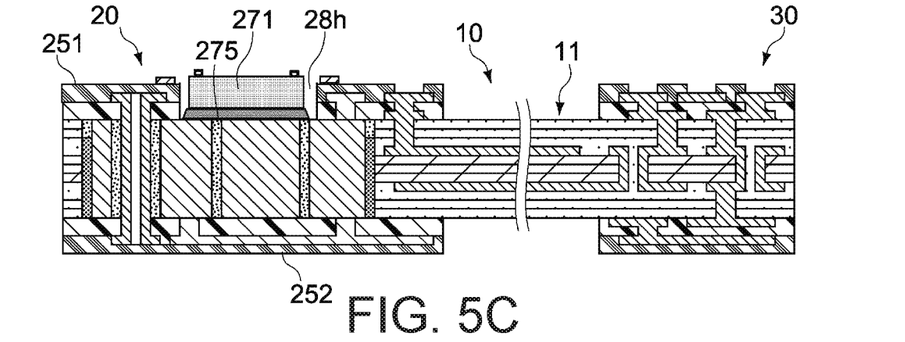

Next, as shown in FIG. 5C, the semiconductor element 271 is housed in the recess 28h. The semiconductor element 271 is mounted on the reinforcing member 23 with the joining member 275 therebetween using the face-up method, for example.

Figure 5D:
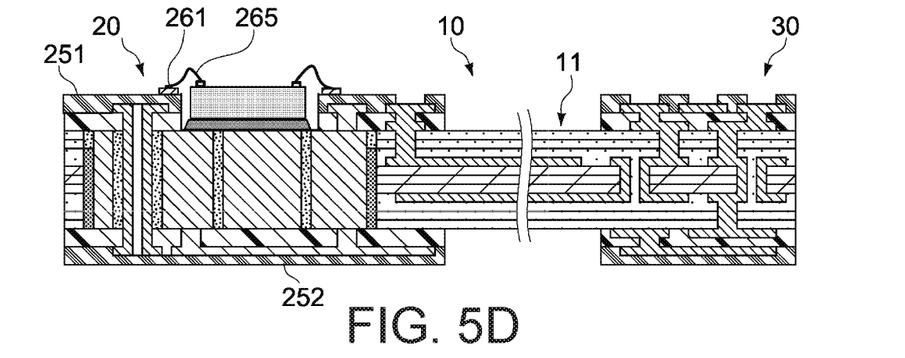

Thereafter, as shown in FIG. 5D, the semiconductor element 271 and the bonding pad 261 are electrically connected via the bonding wires 265 using wire bonding.

In the circuit board 1 that is configured as described above, the plate-shaped reinforcing member 23 is embedded in the first end 11a of the flexible wiring board 11 in the second substrate main body 20; thus, the strength of the second substrate main body 20 increases.

Furthermore, in the circuit board 1, the semiconductor element 271 is mounted on the reinforcing member 23; thus, the flatness of the base of the semiconductor element 271 increases.

If a solid state imaging element is mounted on the multilayer wiring layer 281, there may be cases in which the alignment and optical precision of the solid state imaging element is poor due to variations in the thickness of the multilayer wiring layer 281 each time the multilayer wiring layer 281 is formed and due to variations in thickness within the plane of the multilayer wiring layer 281.

As a countermeasure, in the circuit board 1, the semiconductor element 271, such as a solid state imaging element, is disposed on the plate-shaped reinforcing member 23; thus, it is possible to disregard variations in the thickness of the multilayer wiring layer 281 each time the multilayer wiring layer 281 is formed, as well as variations in thickness within the plane of the multilayer wiring layer 281. As a result, the solid state imaging element will have excellent alignment and optical precision. Furthermore, if the base of the semiconductor element 271 is the metal reinforcing member 23, the heat-dissipating effect of the reinforcing member 23 increases, and the semiconductor element 271 is efficiently cooled.

In addition, when the reinforcing member 23 is at the ground potential, it is possible to avoid the time and effort of leading out ground wiring while staying away from the reinforcing member 23 in the circuit board 1. Furthermore, electromagnetic waves from outside the circuit board 1 or from the semiconductor element 271 are blocked by the reinforcing member 23.

In addition, according to the present embodiment, by appropriately roughening the primary surface 23u of the reinforcing member 23, it is possible to increase the joining strength between the joining member 275 and reinforcing member 23 via an anchor effect.

In addition, in the circuit board 1, the bonding pad 261 is disposed directly above the reinforcing member 23; thus, the base strength of the bonding pad 261 is stronger. As a result, when the bonding wires 265 are joined to the bonding pad 261, the bonding pad 261 that contacts the bonding wires 265 is less likely to shift. Here, "shift" means sinking, horizontal shifts, and the like of the bonding pad 261 during wire bonding, for example.

Embodiment 2

Figure 6:
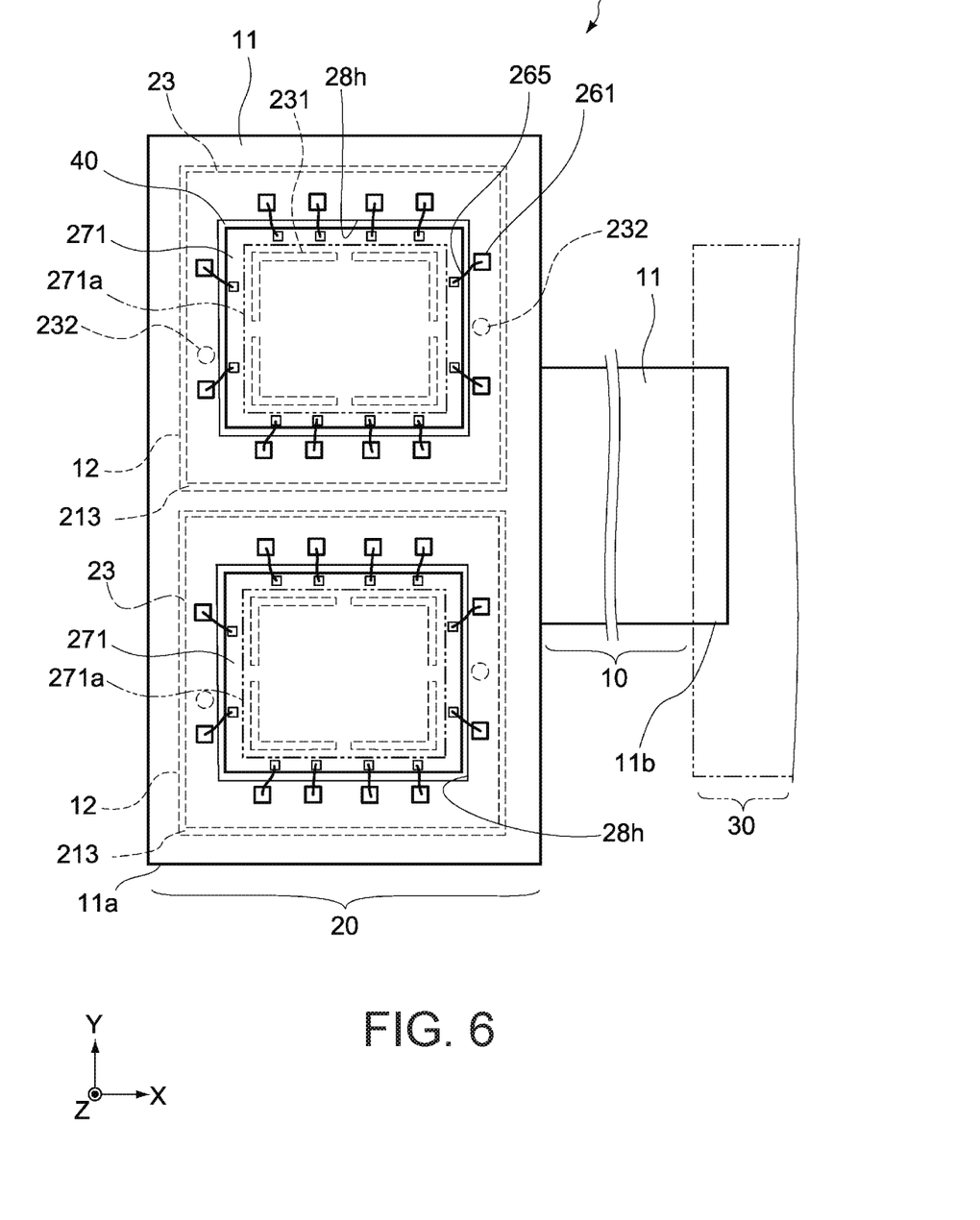
FIG. 6 is a schematic plan view that shows a configuration of a circuit board according to Embodiment 2 of the present invention.

FIG. 6 is a schematic plan view that shows a configuration of a circuit board according to Embodiment 2 of the present invention.

In a circuit board 2 shown in FIG. 6, a plurality of semiconductor elements 271 are mounted on the first end 11a. In FIG. 6, an example is shown in which two semiconductor elements 271 are jointly provided in the Y axis direction, for example. The two semiconductor elements 271 are respectively provided on the reinforcing members 23.

In the circuit board 2, the two semiconductor elements 271 are mounted on the second substrate main body 20 such that the imaging surfaces 271a of the two respective semiconductor elements 271 are parallel to each other, for example. Since the reinforcing member 23 is used in the present embodiment, it is possible to increase the strength of the second substrate main body 20, and it becomes easy to make the circuit board larger. As a result, it is possible to form a multifunctional and high-functionality circuit module while making the circuit board thinner as a whole. Such a configuration is also included in the present invention.

Embodiment 3

Figure 7:
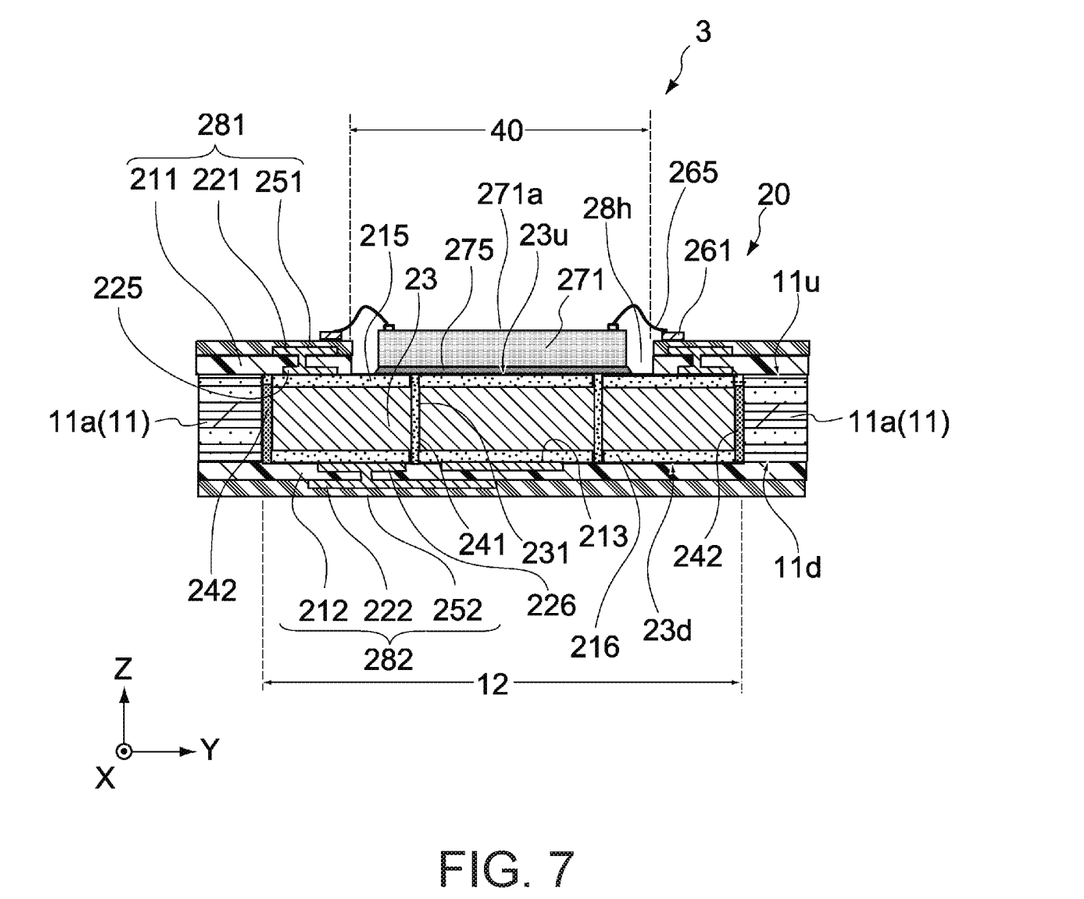
FIG. 7 is a schematic cross-sectional view that shows a configuration of a circuit board according to Embodiment 3 of the present invention.

FIG. 7 is a schematic cross-sectional view that shows a configuration of a circuit board according to Embodiment 3 of the present invention. FIG. 7 corresponds to the cross-sectional view in the line B-B direction of FIG. 1.

As in the circuit boards 1, 2, the reinforcing member 23 is housed in the housing section 213 in a circuit board 3. However, in the circuit board 3, wiring 225 is provided on the primary surface 23u side of the reinforcing member 23, and wiring 226 is provided on the primary surface 23d side of the reinforcing member 23. In the housing section 213, an insulating layer 215 is provided on the primary surface 23u of the reinforcing member 23 and an insulating layer 216 is provided on the primary surface 23d, for example. Furthermore, the wiring 225 is provided on the insulating layer 215, and the wiring 226 is provided on the insulating layer 216. The wiring 225 is electrically connected to the wiring 221 by means of a via, for example, and the wiring 226 is electrically connected to the wiring 222 by means of a via, for example. Here, the reinforcement member 23 together with the insulting layers 215 ad 216 on both sides may be regarded as constituting a single (combined) reinforcing member having insulating layer surfaces on a core member. This configuration is also included in the present invention.

A configuration in which the wiring 225, 226 is disposed on both primary surfaces 23u, 23d of the reinforcing member 23 may be combined with the circuit board 2 of Embodiment 2.

Embodiments of the present invention were described above; however, the present invention is not limited to the above-mentioned embodiments only, and various modifications can naturally be made. The respective embodiments are not limited to being stand-alone embodiments, and can be combined to the extent that is technically possible.

For example, in the above-described embodiments, the planar shapes of the second substrate main body 20 and the reinforcing member 23 were both formed in a rectangular shape; however, the present invention is not limited to this, and the planar shapes of the second substrate main body 20 and the reinforcing member 23 may be formed in a polygon other than a rectangle, a circle, or other geometric shapes.

In addition, while the control board 30 was provided on the second end 11b of the flexible wiring board 11, a contact component such as a connector may be provided in place of the control board 30.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A circuit board, comprising:
    a flexible wiring board having a first section in one end and a second section next to the first section in a plan view;
    a plate-shaped reinforcing member embedded in the flexible wiring board in the first section, the plate-shaped reinforcing member having a groove therein penetrating vertically through the plate-shaped reinforcing member, the groove being filled with an insulating material so that a top surface of the insulating material filling in the groove is flush with a top surface of the plate-shaped reinforcing member; and
    a first multilayer wiring layer on a top surface of the flexible wiring board in the first section, the first multilayer wiring layer having an opening that exposes a portion of the top surface of the reinforcing member for mounting a device thereon,
    wherein the portion of the top surface of the reinforcing member exposed in the opening for mounting the device together with the top surface of the insulating material filling in the groove has a flat continuous surface for an entire area under the opening, and
    wherein a thickness of the reinforcing member is equal to a total thickness of the second section of the flexible wiring board.

2. The circuit board according to claim 1, further comprising a second multilayer wiring layer on a bottom surface of the flexible wiring board in the first section.

3. The circuit board according to claim 1, the first multilayer wiring layer includes a bonding pad disposed directly above a portion of the reinforcing member that is not exposed by the opening.

4. The circuit board according to claim 1, wherein the portion of the top surface of the reinforcing member exposed in the opening is coated with a conductive layer.

5. The circuit board according to claim 1, wherein the reinforcing member includes a core member and an insulating layer formed thereon so that the exposed portion of the top surface of the reinforcing member is an insulating surface.

6. The circuit board according to claim 1, wherein the first multilayer wiring layer on the flexible wiring board in the first section has another opening that exposes another portion of the top surface of the reinforcing member for mounting another device thereon.

7. A circuit module, comprising:
    a flexible wiring board having a first section in one end and a second section next to the first section in a plan view;
    a plate-shaped reinforcing member embedded in the flexible wiring board in the first section, the plate-shaped reinforcing member having a groove therein penetrating vertically through the plate-shaped reinforcing member, the groove being filled with an insulating material so that a top surface of the insulating material filling in the groove is flush with a top surface of the plate-shaped reinforcing member;
    a first multilayer wiring layer on a top surface of the flexible wiring board in the first section, the first multilayer wiring layer having an opening that exposes a portion of the top surface of the reinforcing member in the first section; and
    a semiconductor device face-up mounted on the portion of the top surface of the reinforcement member exposed by the opening in the first multiplayer wiring layer, wherein the portion of the top surface of the reinforcing member exposed in the opening for mounting the device together with the top surface of the insulating material filling in the groove has a flat continuous surface for an entire area under the opening, and wherein a thickness of the reinforcing member is equal to a total thickness of the second section of the flexible wiring board.

8. The circuit module according to claim 7, wherein the semiconductor device is mounted on the reinforcing member with a conductive joining member therebetween.

9. The circuit module according to claim 7, wherein the semiconductor device is a solid state imaging element.

10. A circuit board, comprising:

a flexible wiring board having a plurality of layers laminated therein, including wiring layers and insulating layers, the wiring board having three sections arranged in a lengthwise direction of the wiring board: a first section in one end, a second section in a middle, and a third section in another end, the first section having a cavity or cutout in a plan view, a plate-shaped reinforcing member having a flat top surface, embedded in the cavity or cutout of the wiring board in the first section, the plate-shaped reinforcing member having a groove therein penetrating vertically through the plate-shaped reinforcing member, the groove being filled with an insulating material so that a top surface of the insulating material filling in the groove is flush with a top surface of the plate-shaped reinforcing member;

a first multilayer wiring layer on a top surface of the wiring board in the first section, the first multilayer wiring layer having an opening that exposes a portion of the flat top surface of the reinforcing member for mounting a device thereon, the first multilayer wiring layer being absent on the wiring board in the second section;

a second multilayer wiring layer on a bottom surface of the wiring board in the first section, the second multilayer wiring layer being absent on the wiring board in the second section, wherein the portion of the top surface of the reinforcing member exposed in the opening for mounting the device together with the top surface of the insulating material filling in the groove has a flat continuous surface for an entire area under the opening, and wherein a thickness of the reinforcing member is equal to a total thickness of the second section of the flexible wiring board.

11. A circuit module, comprising:

the circuit board as set forth in claim 10; and said device mounted on the exposed portion of the flat top surface of the reinforcing member, said device being electrically connected to a wiring in the first multilayer wiring layer in the first section.

* * * * *